(12) United States Patent
Lin et al.

(10) Patent No.: US 7,687,211 B2
(45) Date of Patent: Mar. 30, 2010

(54) SYSTEM AND METHOD FOR PHOTOLITHOGRAPHY IN SEMICONDUCTOR MANUFACTURING

(75) Inventors: Shui-Tien Lin, Hsin-Chu (TW);
Shin-Rung Lu, Chu-Pei (TW);
Yi-Chuan Lo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 911 days.

(21) Appl. No.: 11/193,126

(22) Filed: Jul. 29, 2005

(65) Prior Publication Data

US 2006/0228865 A1 Oct. 12, 2006

Related U.S. Application Data

(60) Provisional application No. 60/669,524, filed on Apr. 8, 2005.

(51) Int. Cl.
*G03F 9/00* (2006.01)
*G03C 5/00* (2006.01)

(52) U.S. Cl. .................... 430/30; 430/302; 430/311; 355/52; 355/53; 355/55; 355/67; 355/77

(58) Field of Classification Search ............... 430/30, 430/302, 311; 355/52, 53, 55, 67, 77
See application file for complete search history.

(56) References Cited

U.S. PATENT DOCUMENTS

| | | | | |
|---|---|---|---|---|
| 5,895,737 A | * | 4/1999 | McCullough et al. | 430/30 |
| 6,013,401 A | * | 1/2000 | McCullough et al. | 430/30 |
| 6,586,146 B2 | * | 7/2003 | Chang et al. | 430/30 |
| 6,866,974 B2 | * | 3/2005 | Kim et al. | 430/30 |
| 2003/0044700 A1 | | 3/2003 | Chang et al. | |

OTHER PUBLICATIONS

Taiwan Patent Office, Taiwan Office Action, mailed Jul. 3, 2007, Application No. 095112357, 4 pages.

* cited by examiner

*Primary Examiner*—Christopher G Young
(74) *Attorney, Agent, or Firm*—Haynes and Boone, LLP

(57) ABSTRACT

A method for photolithography in semiconductor device manufacturing comprises defining test critical dimension target for a photolithography mask, measuring a mask critical dimension, comparing mask critical dimension to the test critical dimension target and determining a critical dimension deviation, determining a photolithography light base energy in response to the critical dimension deviation, and exposing the wafer according to the photolithography light base energy.

11 Claims, 2 Drawing Sheets

SYSTEM AND METHOD FOR PHOTOLITHOGRAPHY IN SEMICONDUCTOR MANUFACTURING

CROSS-REFERENCE TO RELATED APPLICATIONS

This application claims the benefit of commonly assigned U.S. Provisional Application No. 60/669,524 entitled "A System and Method for Photolithography in Semiconductor Manufacturing" filed on Apr. 8, 2005, the entirety of which is hereby incorporated by reference herein.

BACKGROUND

Since the inception of the semiconductor industry, photolithography has been used for forming the components of integrated circuits. Generally, light beams pass through a mask, which has been patterned with a magnified image of the relevant integrated circuits. The light beams are then focused by a projection lens onto a wafer, resulting in an image of the integrated circuits in the photoresist layer of the wafer.

Among other factors, mask defects constitute a source of yield reduction. Specifically, the deviation of the mask image will result in the imperfection of the image on the wafer.

Even though the defects of the mask image are detected during mask verification and validation, traditional approaches for wafer fabrication fail to take advantage of such information. As shown in FIG. 1, after a customer 2 completes the design of the integrated circuits, the design data may be stored in a tape and forwarded to a mask formation unit 4 for purposes of generating a corresponding mask. Then, the completed mask may be dispatched to a wafer fabrication unit 6 to be used for semiconductor integrated circuit fabrication. Because mask formation is often imperfect and causes deviation in mask dimensions, wen the wafer fabrication facility performs mask verification and validation, a trial-and-error process is often used, which results in wasted time, funds and energy. The resultant product cycle time for product verification and validation and time-to-market is prolonged. This problem is only aggravated by the shrinking device dimensions.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
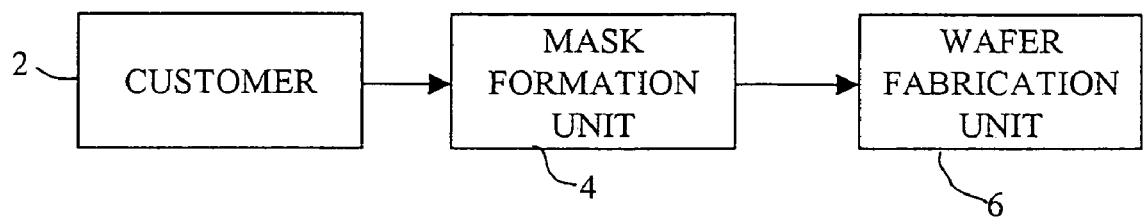
FIG. 1 is a simplified diagram of selected components of a semiconductor manufacturing facility.

It is to be understood that the following disclosure provides many different embodiments or examples for implementing different features of the disclosure. Specific examples of components and arrangements are described below. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

In one embodiment, the present disclosure relies on the collaboration between the mask formation unit 4 and the wafer fabrication unit 6. Instead of merely forwarding the completed mask to the wafer fabrication unit 6, data indicating mask defects are also forwarded to the wafer fabrication unit 6. As a result, prior to the first run of the exposure process, the wafer fabrication unit 6 may derive compensation energy based on the mask defects, and optimize the base energy accordingly.

Figure 3:
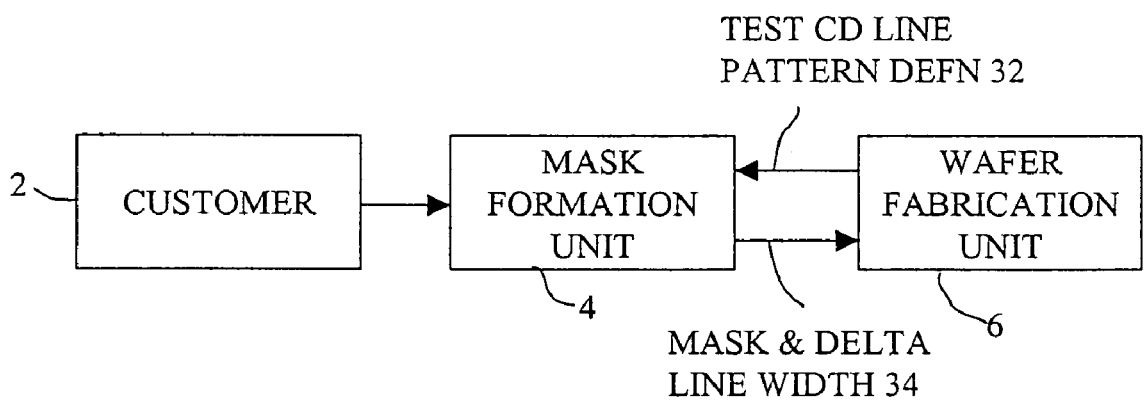
FIG. 3 is a simplified flow diagram of selected components of a semiconductor manufacturing facility.
Figure 2:
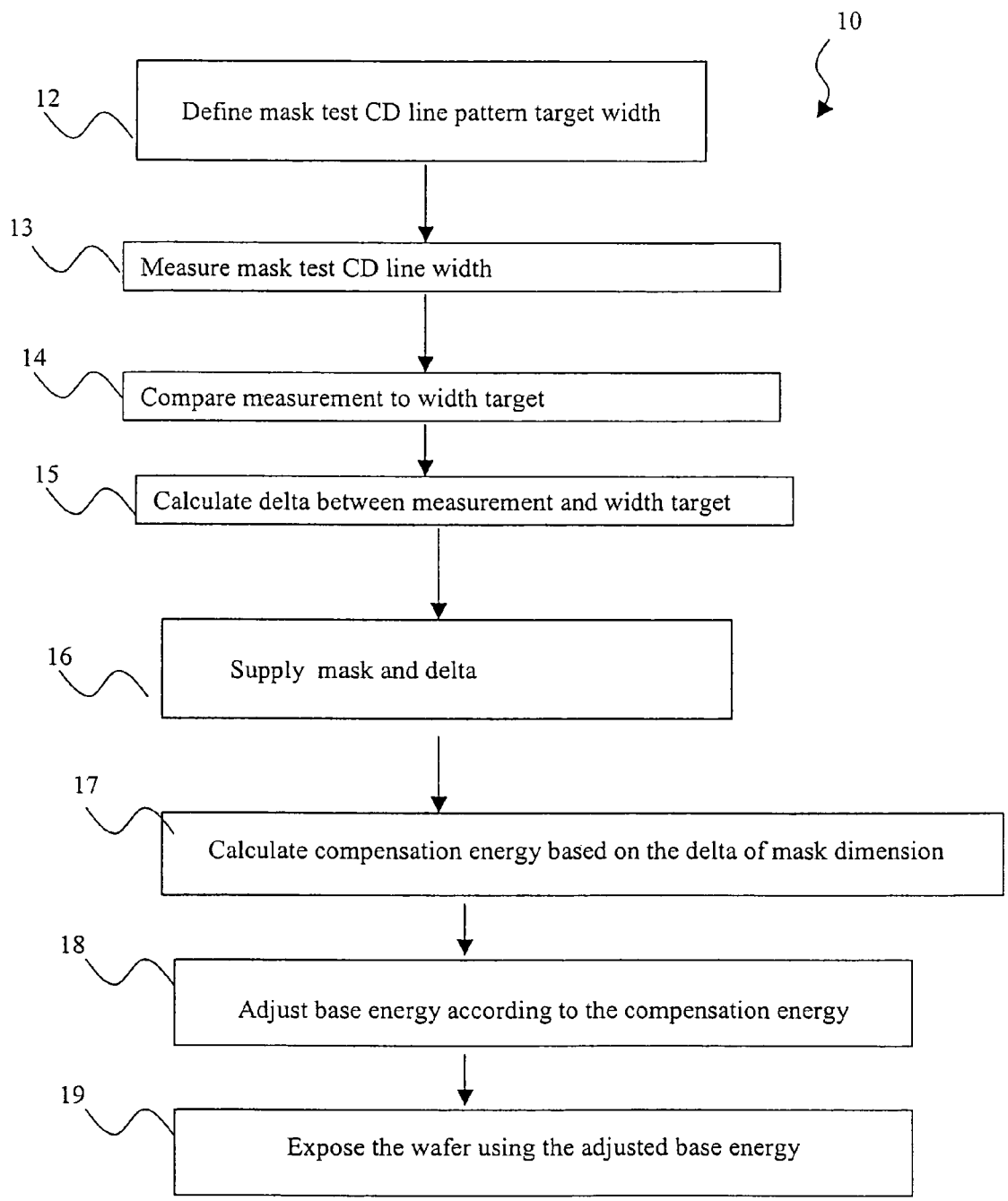
FIG. 2 is a simplified flowchart of an embodiment of a new method of photolithography.

Referring now to FIG. 2, shown therein is a simplified flowchart of an embodiment of a new photolithography method 10. Referring also to FIG. 3 for a simplified diagram of a data flow diagram. In step 12, the wafer fabrication business unit 6 defines a test CD line pattern target width 32 for a particular mask and provides this target width to the mask formation business unit 4. The mask formation business unit 4 makes the mask according to specifications from the customer and takes measurements of the mask test CD line width of the mask in step 13. The measurement may be conducted by one or more metrology instruments and/or other methods known in the art. The resultant mask may include defects, which may be caused by erred design of mask patterns, flaws occurred during the pattern generation process, fabrication process, handling of the mask, and other defective manufacturing steps. In one example, during the fabrication of the mask, defects of the mask may be caused by bubbles, scratches, pits, fractures, and other factors. The wafer fabrication unit 6 transmits the test CD line target to the mask formation unit 4. The transmission of this data may be done electronically such as using file transfer protocol (FTP), electronic mail, or another suitable way. A more formalized communication portal or interface may also be provided between the customer 2, mask formation unit 4, and wafer fabrication unit 6. In step 14, the measured line width is compared with the pre-defined mask CD line target width. In step 15, a delta, delta_DOM, between the measured line width is compared with the pre-defined mask CD line target width is determined.

The mask that has been constructed as well as the delta width 34 are then supplied to the wafer fabrication business unit 6 in step 16. The transmission of this data may be done electronically such as using file transfer protocol (FTP), electronic mail, or another suitable way. In step 17, a compensation energy is calculated based on the delta width. The compensation energy is an amount to be applied to a base energy that is representative of the intensity of the photolithography light. Therefore, an adjustment or modulation of the base energy will vary the intensity of the light used in photolithography. In one embodiment, the calculation may include the following formula: compensation energy=$f$(delta_DOM), wherein $f$ is a linear or nonlinear function. The function $f$ may be derived based on a variety of factors, such as the specific manufacturing technology, the mask layer, and/or a variety of other factors. Further, the function $f$ may be refined to achieve greater precision by several approaches, such as regressing the original formula in a polynomial form or other forms by a statistical tool, and/or using a greater collection data to refine the function as the manufacturing activity progresses. The function $f$ may also be determined by a number of methods, such as experiments, first data analysis, and/or other methods. For example, for the manufacturing of 0.15 μm logic devices, the function $f$ may be: compensation energy=33.83×delta$_{DOM}$_2.0726. As noted above, the function $f$ is not fixed. For example, in another case, if delta_ DOM is equal to about 0.002 um, the resulting compensation energy may be determined to be about 2.73426 mj. In step 18, the base energy is adjusted by the amount of the compensation energy so that the wafer is exposed using the. adjusted base energy. The adjusted base energy may be equal to the sum of the original base energy and the compensation energy. Alternatively, the adjusted base energy may be equal to the difference between the original base energy and the compensation energy. The exposure may be accomplished by any methods know in the art, and may include dry lithography or wet lithography. In the case of wet lithography, the wavelength of the radiation may be 193 nm, 157 nm, and/or other figures.

The method 10 described above may be utilized in the manufacturing of a variety of semiconductor devices, such as memory devices (including but not limited to a static random access memory (SRAM)), logic devices (including but not limited to a metal-oxide semiconductor field-effect transistor (MOSFET)), and/or other devices. The transfer of various data may be performed via electronic transmissions such via electronic mail, web interface (Hypertext Transfer Protocol (HTTP) or Hypertext Transfer Protocol Secure (HTTPS)), File Transfer Protocol (FTP), Extensible Markup Language (XML), and/or any other suitable means now known or to be developed.

Many variations of the above example are contemplated herein. In one example, the mask formation unit 4 and the wafer fabrication unit 6 may belong to one business entity. In another example, deviation of the mask dimension delta_ DOM may include any data relating to mask defects that may be used to adjust the lithography process other than or including the base energy. In another example, the mask formation unit 4 may simply forward data relating to the mask 24, while the wafer fabrication unit 6 may compare the data with the original specification to determine the CD line width deviation or delta. Therefore, a variety of modifications are contemplated by the present disclosure.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. A method for photolithography in semiconductor device manufacturing, comprising:
    defining test critical dimension target for a photolithography mask;
    measuring a mask critical dimension;
    comparing mask critical dimension to the test critical dimension target and determining a critical dimension deviation;
    determining a photolithography light base energy in response to the critical dimension deviation; and
    exposing the wafer according to the photolithography light base energy.

2. The method of claim 1, further comprising calculating a photolithography light compensation energy in response to the critical dimension deviation and adjusting the photolithography light base energy in response to the calculated compensation energy.

3. The method of claim 1, wherein defining the test critical dimension target comprises defining the test critical dimension target at a wafer fabrication unit.

4. The method of claim 3, wherein determining a critical dimension deviation comprises determining a critical dimension deviation at a mask formation unit.

5. The method of claim 4, further comprising transmitting the test critical dimension target from the wafer fabrication unit to the mask formation unit.

6. The method of claim 5, wherein transmitting the test critical dimension target comprises transmitting the data electronically.

7. The method of claim 5, further comprising:
    forming a mask according to a customer-provided design at a mask formation unit; and
    transmitting the mask and the critical dimension deviation from the mask formation unit to the wafer fabrication unit.

8. The method of claim 7, wherein transmitting the mask and critical dimension deviation comprises transmitting the data electronically.

9. A method for semiconductor device manufacturing, comprising:
    defining a test critical dimension line pattern target at a wafer fabrication unit; measuring the test critical dimension line pattern width;
    supplying the test critical dimension line pattern width measurement to a mask formation unit;
    receiving a mask and a critical dimension deviation determined from a comparison between the test critical dimension line pattern width measurement and a critical dimension measurement of the mask;
    determining a photolithography light compensation energy in response to the critical dimension deviation;
    optimizing a photolithography light base energy in response to the compensation energy;
    supplying the photolithography light compensation energy and the mask to the wafer fabrication unit; and
    exposing the wafer using the optimized energy for a first run at the wafer fabrication unit.

10. A method for semiconductor device manufacturing, comprising:
    receiving a circuit design for a wafer;
    defining a test critical dimension line pattern target at a wafer fabrication unit;
    measuring the test critical dimension line pattern width;
    supplying the test critical dimension line pattern width measurement to a mask formation unit;
    forming a mask at the mask formation unit; measuring the mask critical dimension width;
    comparing the test critical dimension line pattern width measurement to the mask critical dimension width measurement and determining a critical dimension deviation;
    determining a photolithography light compensation energy in response to the critical dimension deviation;
    optimizing a photolithography light base energy in response to the compensation energy;
    supplying the photolithography light compensation energy and the mask to the wafer fabrication unit; and
    exposing the wafer using the optimized energy for a first run at the wafer fabrication unit.

11. A system for semiconductor device manufacturing, comprising:
- means for defining a test critical dimension line pattern target at a wafer fabrication unit;
- means for measuring the test critical dimension line pattern width;
- means for supplying the test critical dimension line pattern width measurement to a mask formation unit;
- means for receiving a mask and a critical dimension deviation determined from a comparison between the test critical dimension line pattern width measurement and a critical dimension measurement of the mask;
- means for determining a photolithography light compensation energy in response to the critical dimension deviation;
- means for optimizing a photolithography light base energy in response to the compensation energy;
- means for supplying the photolithography light compensation energy and the mask to the wafer fabrication unit; and
- means for exposing the wafer using the optimized energy for a first run at the wafer fabrication unit.

* * * * *